(12) United States Patent
Mao et al.

(10) Patent No.: US 12,200,915 B2
(45) Date of Patent: Jan. 14, 2025

(54) TEMPERATURE CONTROL DEVICE, METHOD AND SERVER

(71) Applicant: Fulian Precision Electronics (Tianjin) Co., LTD., Tianjin (CN)

(72) Inventors: Tze-Chern Mao, New Taipei (TW); Li-Wen Chang, New Taipei (TW); Yen-Chun Fu, New Taipei (TW); Chih-Hung Chang, New Taipei (TW); Yao-Ting Chang, New Taipei (TW); Chao-Ke Wei, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 174 days.

(21) Appl. No.: 18/072,524

(22) Filed: Nov. 30, 2022

(65) Prior Publication Data

US 2023/0403831 A1    Dec. 14, 2023

(30) Foreign Application Priority Data

Jun. 13, 2022 (CN) .......................... 202210667053.3

(51) Int. Cl.
*H05K 7/20* (2006.01)

(52) U.S. Cl.
CPC ..... *H05K 7/20836* (2013.01); *H05K 7/20145* (2013.01); *H05K 7/20727* (2013.01)

(58) Field of Classification Search
CPC ........... H05K 7/20836; H05K 7/20145; H05K 7/20727
USPC ..................................................... 361/679.49
See application file for complete search history.

(56) References Cited

U.S. PATENT DOCUMENTS

| | | | | | |
|---|---|---|---|---|---|
| 6,058,009 | A | * | 5/2000 | Hood, III | G06F 1/203 |
| | | | | | 361/679.55 |
| 6,104,003 | A | * | 8/2000 | Jones | H05K 7/207 |
| | | | | | 219/400 |
| 6,127,663 | A | * | 10/2000 | Jones | H05K 7/20572 |
| | | | | | 219/209 |
| 7,028,753 | B2 | * | 4/2006 | Sterner | H01L 23/467 |
| | | | | | 165/122 |
| 7,184,268 | B2 | * | 2/2007 | Espinoza-Ibarra | F04D 29/382 |
| | | | | | 415/125 |
| 7,286,356 | B2 | * | 10/2007 | Keenan | H05K 7/20572 |
| | | | | | 312/236 |
| 7,652,880 | B2 | * | 1/2010 | Wayman | F28F 3/048 |
| | | | | | 361/679.48 |
| 7,766,733 | B2 | * | 8/2010 | Kasahara | G06F 1/206 |
| | | | | | 361/679.48 |
| 7,826,215 | B2 | * | 11/2010 | Glover | H05K 7/20727 |
| | | | | | 361/679.49 |

(Continued)

FOREIGN PATENT DOCUMENTS

CN            1164159            8/2004

*Primary Examiner* — Anatoly Vortman
(74) *Attorney, Agent, or Firm* — ScienBiziP, P.C.

(57) ABSTRACT

A temperature control device includes a temperature sensor configured to detect a temperature within a server. When the temperature in the server is below a preset temperature, the control unit controls an interior heating assembly to heat the server, and closes a ventilation assembly to retain heat within the server. When the temperature in the server has reached the preset temperature, the control unit controls the heating assembly to stop the internal heating, and controls the ventilation assembly to open, to allow dissipation of the heat from the server.

20 Claims, 15 Drawing Sheets

(56) References Cited

U.S. PATENT DOCUMENTS

| | | | | |
|---|---|---|---|---|
| 7,965,504 B2* | 6/2011 | Hamlin | ............. | H05K 7/20572 |
| | | | | 361/679.5 |
| 8,035,968 B2* | 10/2011 | Kwon | ................ | H05K 7/20972 |
| | | | | 361/679.48 |
| 8,139,354 B2* | 3/2012 | June | ....................... | G06F 1/206 |
| | | | | 361/679.48 |
| 8,700,188 B2* | 4/2014 | Wu | ................... | H05K 7/20836 |
| | | | | 700/25 |
| 11,540,420 B2* | 12/2022 | Chen | ................. | H05K 7/20727 |
| 11,792,960 B2* | 10/2023 | Wei | ................... | H05K 7/20745 |
| | | | | 454/184 |
| 2003/0053293 A1* | 3/2003 | Beitelmal | ......... | H05K 7/20727 |
| | | | | 174/15.2 |
| 2009/0171613 A1* | 7/2009 | Tsukazawa | ............ | G06F 1/206 |
| | | | | 361/679.49 |
| 2010/0182748 A1* | 7/2010 | Huang | ................... | G06F 1/206 |
| | | | | 361/690 |
| 2013/0079947 A1* | 3/2013 | Wu | ....................... | G06F 1/206 |
| | | | | 700/300 |
| 2013/0242504 A1* | 9/2013 | Cartes | ............... | H05K 7/20836 |
| | | | | 361/691 |
| 2015/0334878 A1* | 11/2015 | Long | ................. | H05K 7/20736 |
| | | | | 165/300 |
| 2022/0279677 A1* | 9/2022 | Chen | ................... | H05K 1/0203 |
| 2023/0184467 A1* | 6/2023 | Chang | ................... | F25B 25/005 |
| | | | | 165/210 |

* cited by examiner

TEMPERATURE CONTROL DEVICE, METHOD AND SERVER

This application claims priority to Chinese Patent Application No. 202210667053.3 filed on Jun. 13, 2022, in China National Intellectual Property Administration, the contents of which are incorporated by reference herein.

FIELD

The subject matter herein generally relates to a field of server technology, in particular, relates to a temperature control device, a temperature control method and a server.

BACKGROUND

With the development of Internet technology, applications of servers are more and more extensive. For a server, temperature is one of fundamental factor that affects proper working of the server. In a low temperature environment, the server may not be able to start normally. By providing a temporary heating device (such as a heater) next to the server, the temperature of the server can be raised, but a lot of material resources are consumed, and the operation is inconvenient. Even the paste or adhesive of an internal heating sheet can also increase the temperature of the server, but the power of the heating sheet is not easy to control, and heating circuits of the heating sheet are scattered in the server, which increases difficulty in access and maintenance of the server.

BRIEF DESCRIPTION OF THE DRAWINGS

Implementations of the present disclosure will now be described, by way of embodiment, with reference to the attached figures.

DETAILED DESCRIPTION

Figure 1:
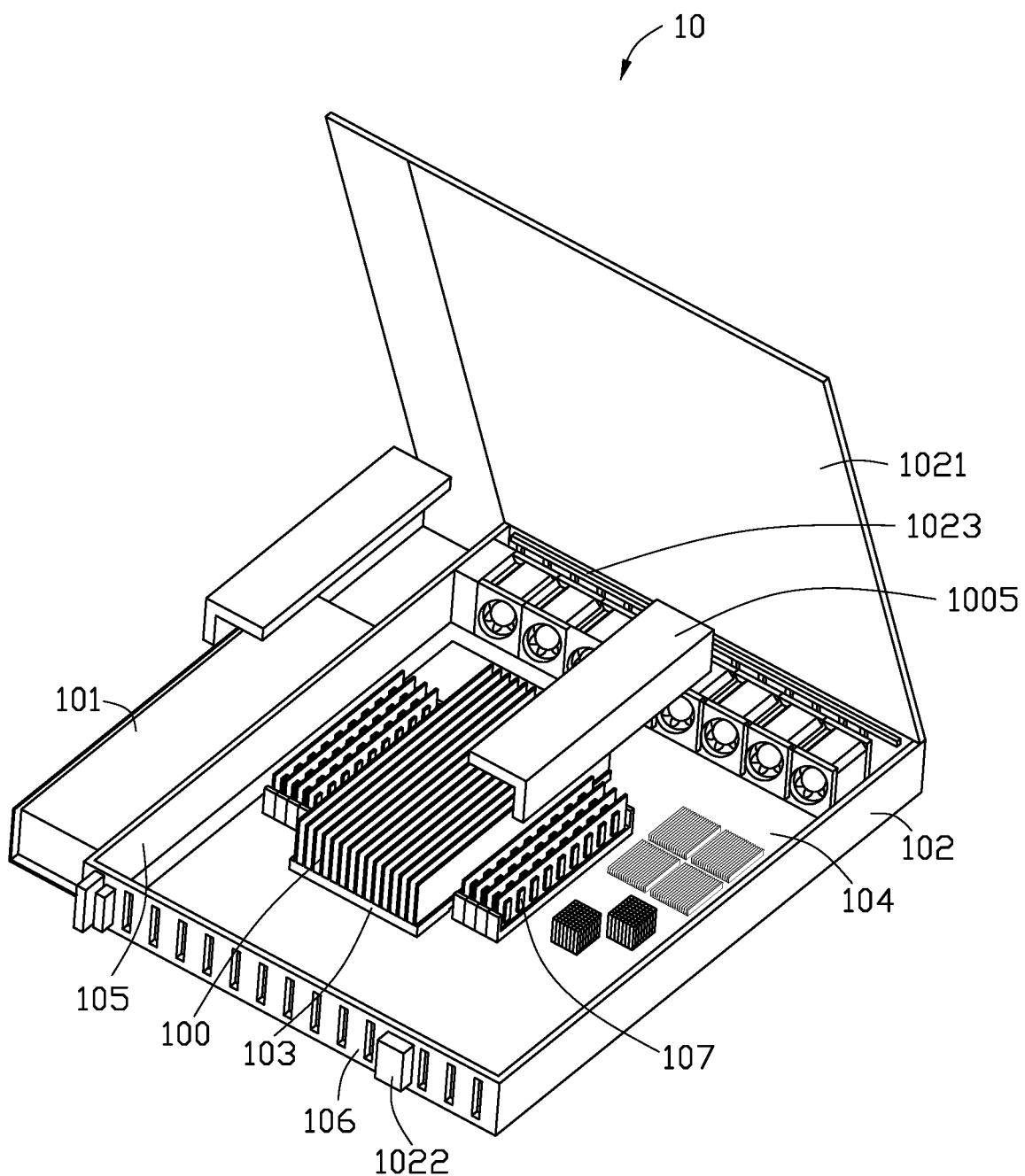
FIG. 1 is a schematic diagram of one embodiment of a server.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The present disclosure, including the accompanying drawings, is illustrated by way of examples and not by way of limitation. Several definitions that apply throughout this disclosure will now be presented. It should be noted that references to "an" or "one" embodiment in this disclosure are not necessarily to the same embodiment, and such references mean "at least one".

In the embodiments of the present disclosure, words such as "first" and "second" are only used to distinguish between different objects, and cannot be understood as indicating or implying relative importance, nor can they be understood as indicating or implying order. For example, the first application, the second application, etc. are used to distinguish different applications, rather than to describe a specific order of the applications, and the features defined as "first" and "second" may expressly or implicitly include one or more of this feature.

FIG. 1 illustrates a server 10. The server includes a power supply 101, a housing 102, a processor 103, and a mainboard 104.

The housing 102 includes an upper cover 1021 and a frame 1022. A first edge 1023 of the upper cover 1021 is connected to one side of the frame 1022. The upper cover 1021 can rotate relative to the frame 1022 around the first edge 1023, so that the housing 102 is switchable between a closed state or an open state. In one embodiment, the housing 102 is provided with a spacer 105, and the ends of the spacer 105 are connected to two opposite sides of the frame 1022, so as to divide an internal space of the housing 102 into a first cavity and a second cavity. The power supply 101 is arranged in the first cavity. The mainboard 104 is arranged in the second cavity. In one embodiment, the processor 103 is arranged on the mainboard 104. The power supply 101 is used to supply power to the mainboard 104 and the processor 103. In one embodiment, the spacer 105 has a through hole, and the power supply 101 is electrically connected to the mainboard 104 and the processor 103 by the through hole, so as to supply power to the mainboard 104 and the processor 103.

In one embodiment, an input/output (I/O) interface 106 is also provided on one side of the frame 1022. An external device is electrically connected to the mainboard 104 by the input/output interface 106 to realize data interaction between the external device and the mainboard 104.

In one embodiment, the mainboard 104 carries a storage device 107. The storage device 107 is used for storing program codes, computer data, and the like. Optionally, other components, such as a Platform Controller Hub (PCH), a Hard Disk Driver (HDD), etc. are also provided on the mainboard 104 to maintain the normal operation of the server 10.

In one embodiment, the server 10 further includes a temperature control device 100. The temperature control device 100 controls the temperature in the server 10, so that the components in the server 10 work normally.

Figure 2:
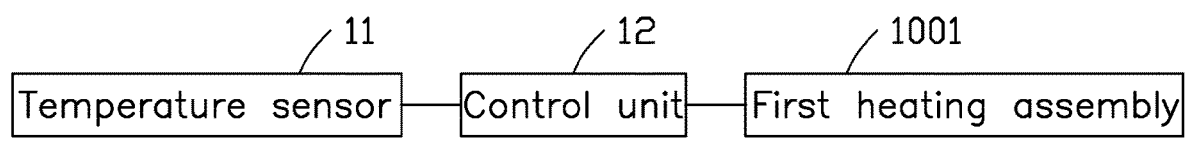
FIG. 2 is a schematic diagram of one embodiment of a circuit module of a temperature control device.

FIG. 2 illustrates a circuit module of the temperature control device 100. The temperature control device 100 includes a temperature sensor 11, a control unit 12, and a first heating assembly 1001.

In one embodiment, the temperature sensor 11 is electrically connected to the control unit 12. The control unit 12 is electrically connected to the first heating assembly 1001. In one embodiment, the control unit 12 includes at least one processor. The at least one processor may be a Central Processing Unit (CPU), and may also be a general-purpose processor, a Digital Signal Processors (DSP), an Application Specific Integrated Circuit (ASIC), a Field-Programmable Gate Array (FPGA) or other programmable logic devices, discrete gate or transistor logic devices, discrete hardware components, etc. The at least one processor can be a microprocessor or the at least one processor can also be any conventional processor, etc. The at least one processor is the control center of the temperature control device 100, using various interfaces and lines to connect various parts of the temperature control device 100.

In one embodiment, temperature sensor 11 is set in the server 10 and is used to sense the temperature in the server 10. The temperature sensor 11 transmits the temperature in the server 10 to the control unit 12 by a temperature signal. The control unit 12 determines whether the temperature in the server 10 is lower than the preset temperature according to the temperature signal. When the temperature in the server 10 is lower than the preset temperature, the control unit 12 determines that the current temperature of the server 10 is lower than a working temperature, and outputs a first control signal to the first heating assembly 1001. When the temperature in the server 10 is not less than the preset temperature, the control unit 12 outputs a second control signal to the first heating assembly 1001.

In one embodiment, the first heating assembly 1001 is arranged on the processor 103. The first heating assembly 1001 is used to heat the server 10 according to the first control signal, or to stop heating the server 10 according to the second control signal.

Thus, the control unit 12 can control the first heating assembly 1001 to heat or stop heating the server 10 according to the temperature in the server 10, to dynamically adjust the temperature in the server 10.

Figure 3:
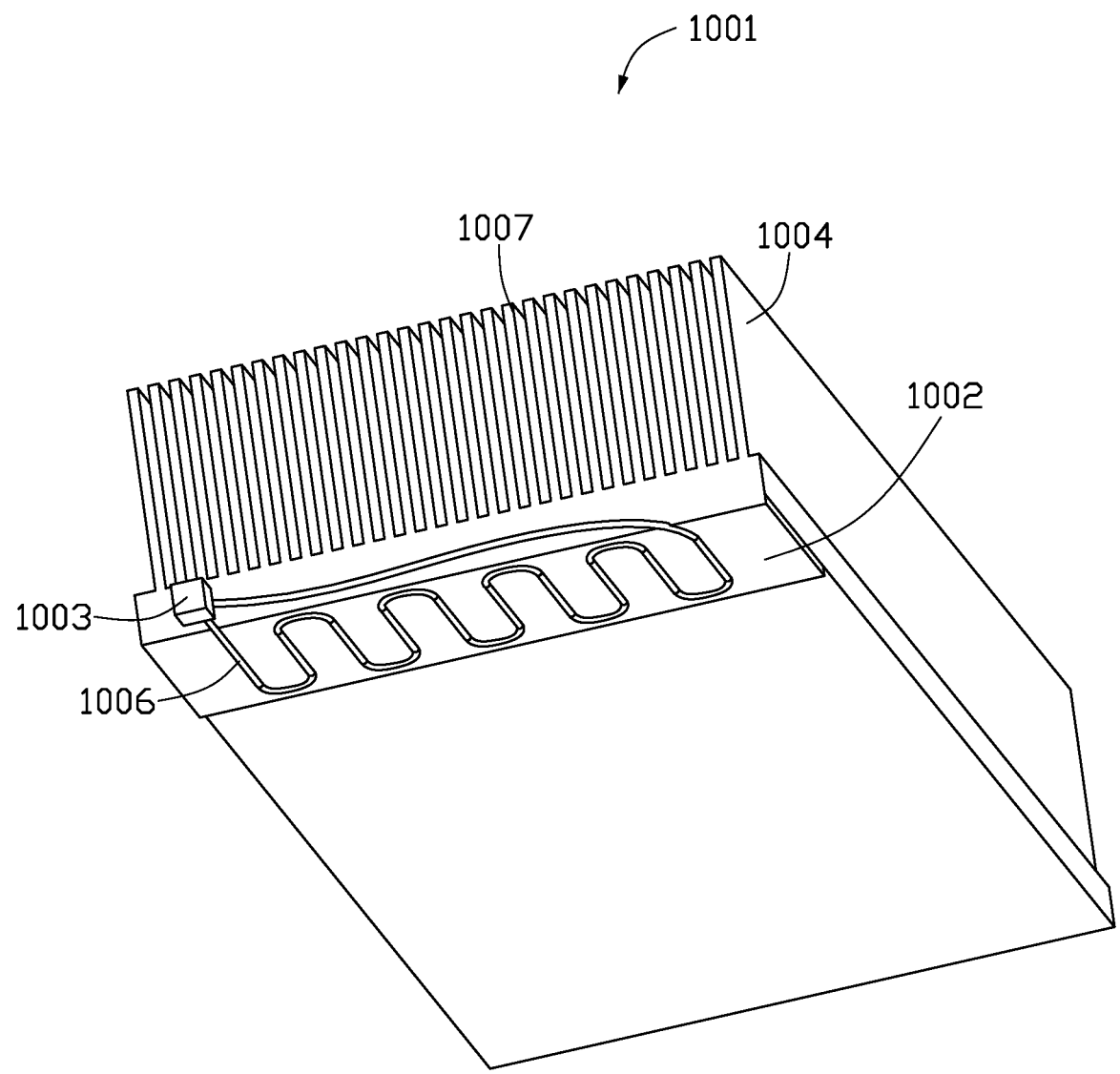
FIG. 3 is a schematic diagram of one embodiment of the temperature control device of FIG. 2.

In one embodiment, the first heating assembly 1001 is arranged on the processor 103. As shown in FIG. 3, the first heating assembly 1001 includes a first heating sheet 1002, a first connecting element 1003, and a first heat dissipation fin set 1004. In one embodiment, the first heating sheet 1002 can be an electric heater. The first heat dissipation fin set 1004 can be arranged on the surface of the processor 103 for gathering heat generated by the processor 103 during operation. The first heat dissipation fin set 1004 includes a number of heat dissipation fins 1007. The heat dissipation fins 1007 may be arranged in a rectangular shape, and each heat dissipation fin 1007 is arranged at an interval. In some embodiments, the heat dissipation fins 1007 can be made of copper, aluminum, or other metal material with good thermal conductivity.

In one embodiment, an air guide member 1005 (shown in FIG. 1) may be arranged on the first heat dissipation fin group 1004, and the air guide member 1005 is used to guide air flow in the server 10, to dissipate heat from the first heat dissipation fin set 1004 to improve the heat dissipation effect.

In one embodiment, the first connecting element 1003 is detachably arranged on one side of the first heat dissipation fin set 1004. The first heating sheet 1002 is attached to a surface of the first heat dissipation fin set 1004. The first heating sheet 1002 sets a first heating circuit 1006. The ends of the first heating circuit 1006 are electrically connected to the first connector 1003. In one embodiment, the first heating circuit 1006 includes a resistance wire, and the first heating circuit 1006 is wound and bent and disposed inside the first heating sheet 1002 to increase a length of the first heating circuit 1006 and optimize the heating effect.

In one embodiment, the first connecting element 1003 is connected to an external power supply or the power supply 101. The first connecting element 1003 receives the first control signal output by the control unit 12 and conducts the electrical connection with the external power supply or the power supply 101 to control the external power supply or power supply 101 to pass current into a heating circuit (for example, the first heating circuit 1006). According to Joule's Law, the current flowing in the heating circuit is converted into heat, causing the first heat dissipation fin set 1004 to heat up. The first heat dissipation fin set 1004 conducts heat to the processor 103 so as to heat the processor 103. In a low temperature environment, the processor 103 can be rapidly heated by the temperature control device 100, so that the server 10 can work normally in a low ambient temperature.

Figure 4:
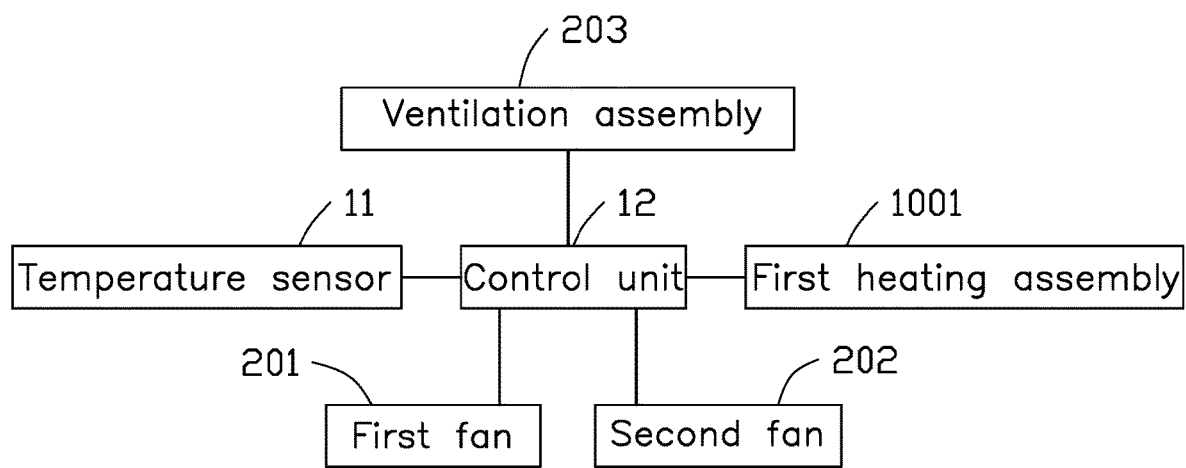
FIG. 4 is a schematic diagram of another embodiment of the circuit module of the temperature control device.

FIG. 4 illustrates another circuit module of the temperature control device 100. In one embodiment, the temperature control device 200 further includes a first fan 201, a second fan 202, and a ventilation assembly 203. The control unit 12 is electrically connected to the first fan 201, the second fan 202, and the ventilation assembly 203.

In one embodiment, the first fan 201 and the second fan 202 conduct the heat in the server 10 to components on the motherboard 104 by air flow, or dissipate the heat generated by the components to the outside by air flow.

In one embodiment, the ventilation assembly 203 dissipates the temperature of the server 10 to an exterior environment, or controls the server 10 to be disconnected from the exterior environment, so that heat in the server 10 can be quickly conducted to the components on the mainboard 104, thereby accelerating the heating rate and efficiency of components in the server 10.

In one embodiment, the control unit 12 outputs a third control signal, or the first control signal, or the second control signal to the first fan 201 and/or the second fan 202. The first fan 201 and/or the second fan 202 may be activated according to the first control signal, to accelerate heat conduction in the server 10. The first fan 201 and/or the second fan 202 may be turned off according to the second control signal to conserve the heat in the server 10.

In one embodiment, if the temperature in the server 10 is less than the preset temperature, the control unit 12 outputs a first control signal to the ventilation assembly 203, and if the temperature in the server 10 is not less than the preset temperature, the control unit 12 outputs a second control signal to the ventilation assembly 203. The ventilation assembly 203 controls the server 10 to connect with the exterior environment according to the first control signal, so that the heat in the server 10 is dissipated, or the ventilation assembly 203 controls the server 10 to disconnect from the exterior environment according to the second control signal, so that the heat in the server 10 can be quickly conducted to the components on the mainboard 104 to accelerate the heating rate and heating efficiency of the components in the server 10.

Figure 5:
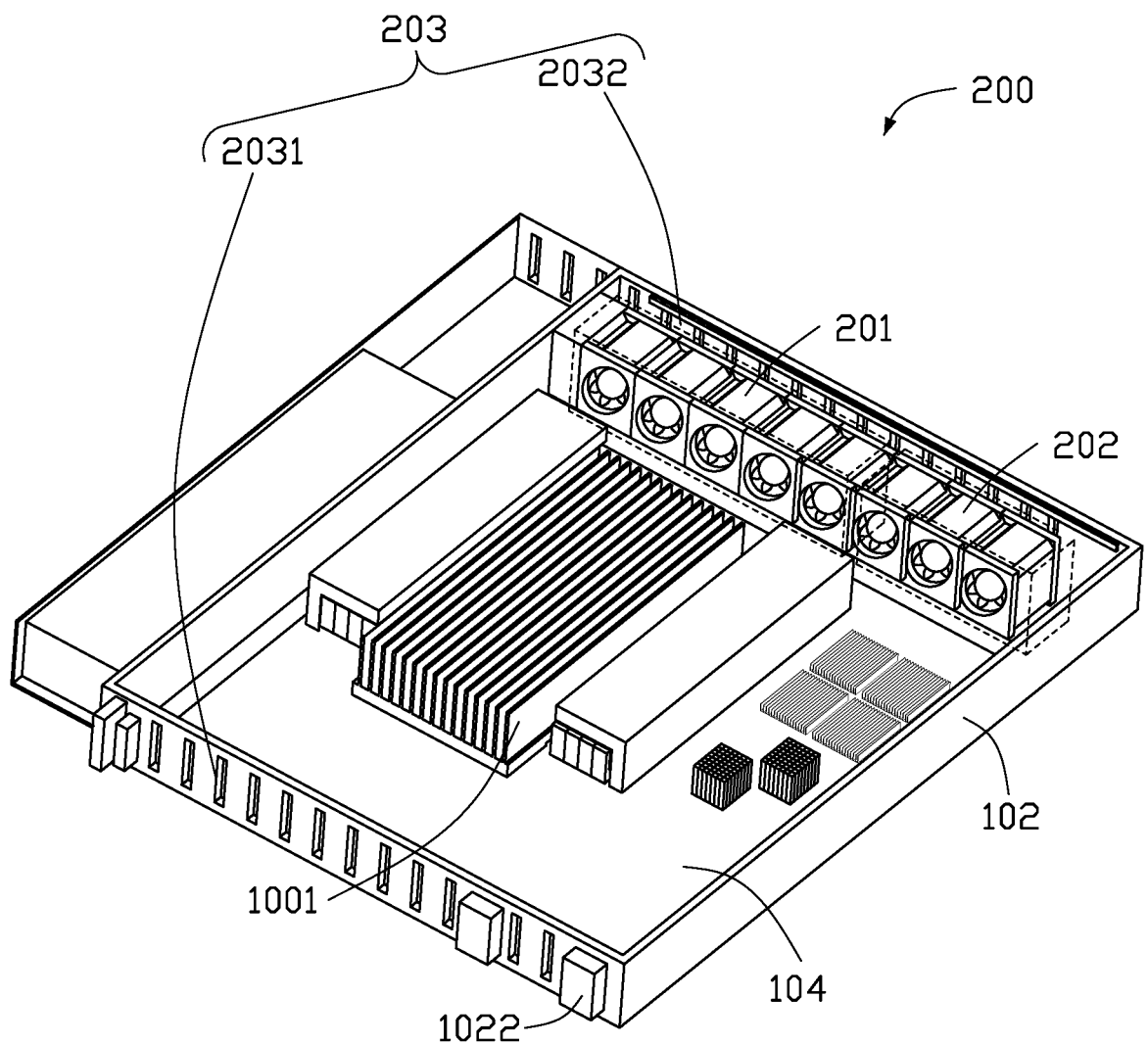
FIG. 5 is a schematic diagram of one embodiment of the temperature control device of FIG. 4.

FIG. 5 illustrates the temperature control device 200. The ventilation assembly 203 includes a first ventilation element 2031 and a second ventilation element 2032. The first fan 201 and the second fan 202 are disposed on the mainboard 104, and the first fan 201 and the second fan 202 are disposed adjacent to each other. The first fan 201 is spaced apart from the first heating assembly 1001. The first ventilation element 2031 and the second ventilation element 2032 are respectively disposed on opposite surfaces of the frame 1022, and the first ventilation element 2031 and the second ventilation element 2032 are disposed opposite to each other. In one embodiment, the number of the first fans 201 is 5, the number of the second fans 202 is 3, and the first fans 201 are arranged on the side of the second fan 202 which is close to the power supply 101.

In one embodiment, the first ventilation element 2031 and the second ventilation element 2032 controls a connection between the server 10 and the exterior environment, so that the heat in the server 10 can be dissipated by the first ventilation element 2031 and/or the second ventilation member 2032. In one embodiment, the first ventilation element 2031 and the second ventilation element 2032 control a path between the server 10 and the exterior environment, by opening or closing the path, and the heat in the server 10 can be quickly conducted to the components on the mainboard 104, and the heating rate and heating efficiency of the components in the server 10 are accelerated.

Figure 6:
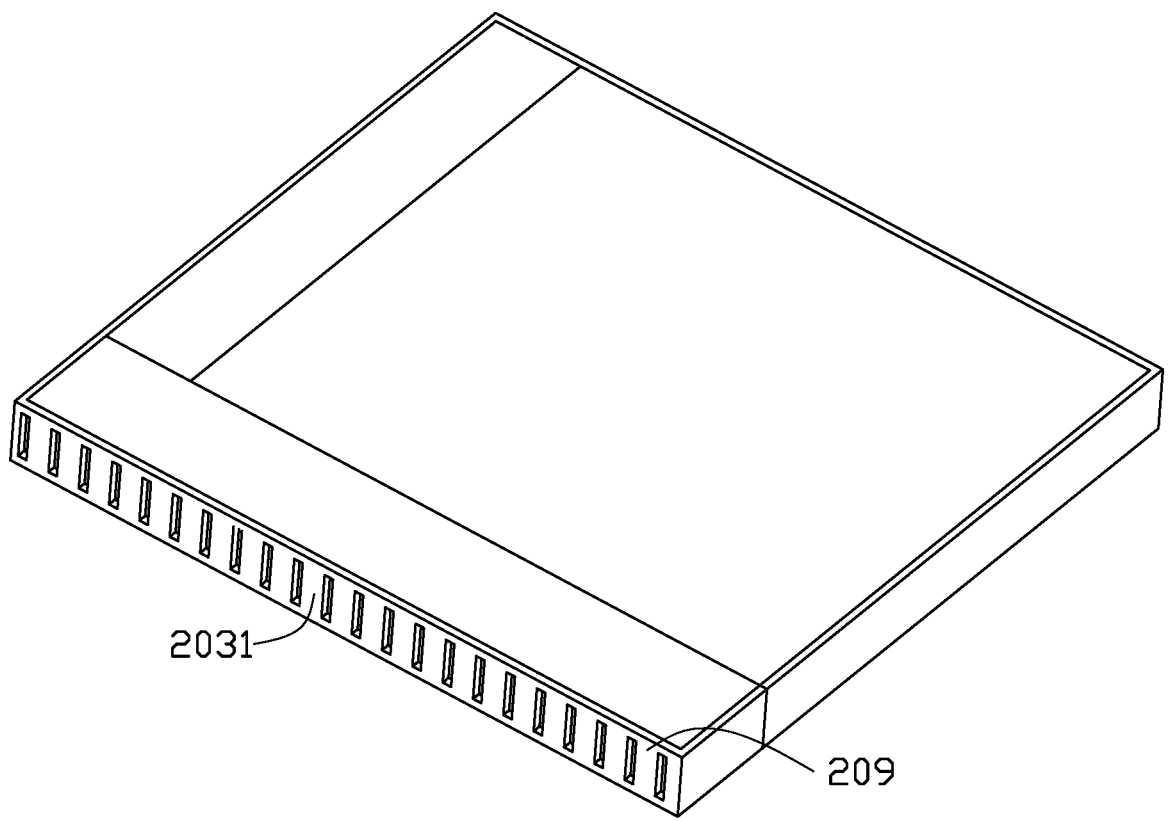
FIG. 6 is a schematic diagram of one embodiment of a first ventilation element disposed on a baffle of the server in FIG. 4.

In one embodiment, the first ventilation element 2031 can also be disposed on a baffle plate outside the server 10, as shown in FIG. 6, to prevent various input/output interfaces 106 being scattered on the frame 1022 of the server 10 and thus making it difficult to set or access the first ventilation element 2031.

Figure 7:
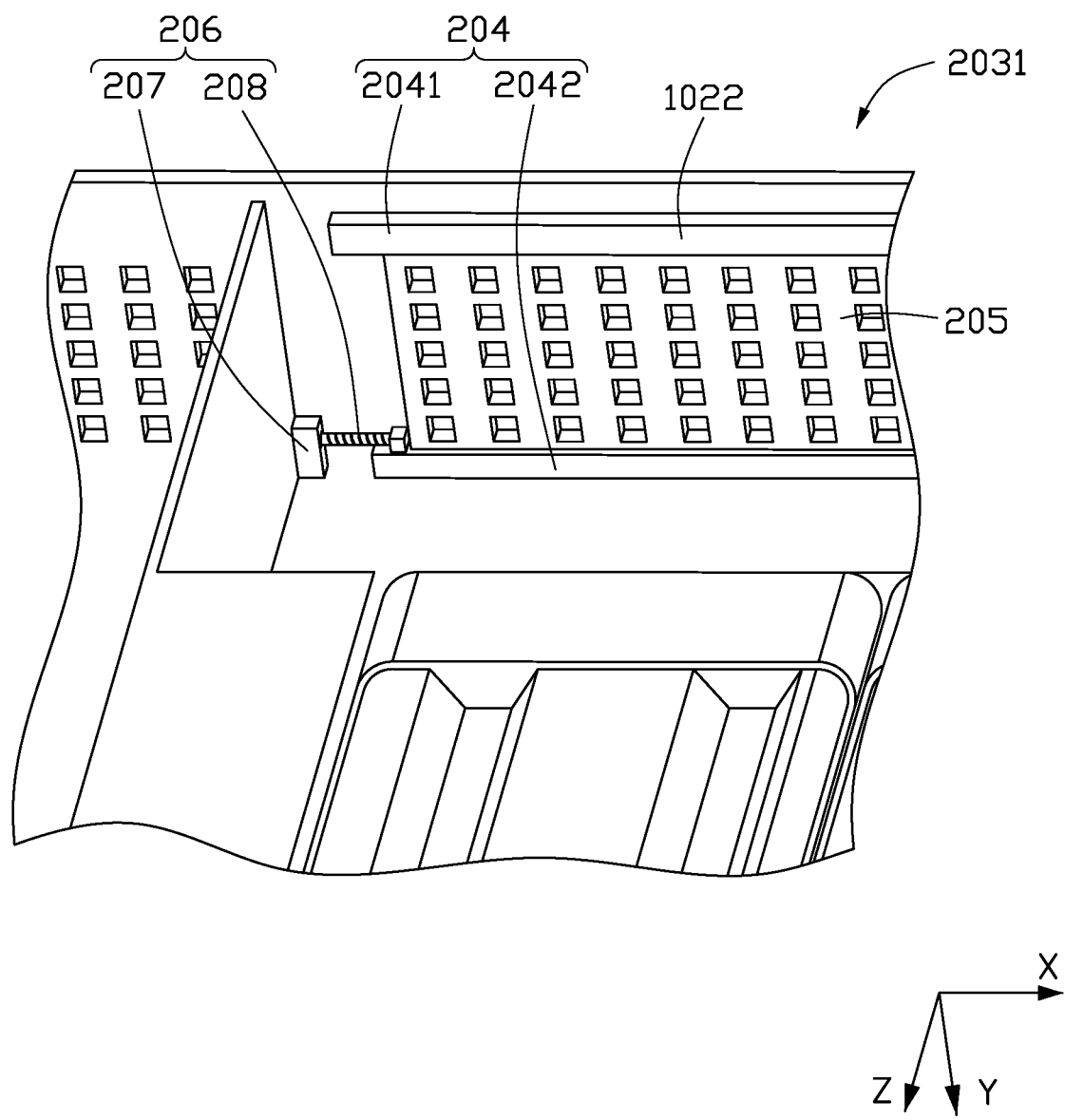
FIG. 7 is a schematic structural diagram of one embodiment of the first ventilation element in an open mode.

FIG. 7 illustrates the first ventilation element 2031 in an open mode. The first ventilation element 2031 includes a track 204, a ventilation plate 205 and a switch assembly 206. The track 204 includes a first extension element 2041 and a second extension element 2042. The first extension element 2041 is substantially L-shaped, protrudes from the surface of the frame 1022 along a first direction (Z direction), and extends along a second direction (Y direction), the second direction being parallel to the surface of the frame 1022. The second extension element 2042 is disposed opposite to the first extension element 2041 in the second direction (Y direction), and a bending direction of the second extension element 2042 is opposite to that of the first extension element 2041. An accommodating space is formed between the first extension element 2041 and the second extension element 2042, and the ventilation plate 205 is arranged in the accommodating space, and the ventilation plate 205 can slide in a third direction (X direction) in the accommodating space. The ventilation plate 205 is provided with a number of evenly-spaced through holes, and the frame 1022 is also provided with a number of through holes to correspond. The structure and working principle of the second ventilation element 2032 are the same as those of the first ventilation element 2031.

In one embodiment, the switch assembly 206 includes a switch 207 and a driving element 208. One end of the driving element 208 is connected to the switch 207, and the other end of the driving element 208 is connected to the ventilation plate 205. The switch 207 is electrically connected to the control unit 12. The switch 207 is used to control the driving element 208 to push or pull the ventilation plate 205 according to the first control signal or the second control signal, so that the ventilation plate 205 slides on the track 204. In one embodiment, the driving element 208 includes an elastic connecting member, and the switching element 207 can drive the elastic connecting member to elastically deform by electromagnetic induction, thereby controlling the ventilation plate 205 to slide on the track 204. In one embodiment, the switch 207 includes an electromagnet. When the electromagnet is energized, a magnetic field is generated, and the elastic connecting member on the ventilation plate 205 is pulled by a magnetic field force.

When the switch 207 receives the second control signal, the switch 207 is switched to an open state, and the driving element 208 controls the ventilation plate 205 to slide, so that the through holes on the ventilation plate 205 are aligned with the through holes on the frame 1022, so as to realize the path between the exterior environment and the server 10 to accelerate heat dissipation from the server 10.

Figure 8:
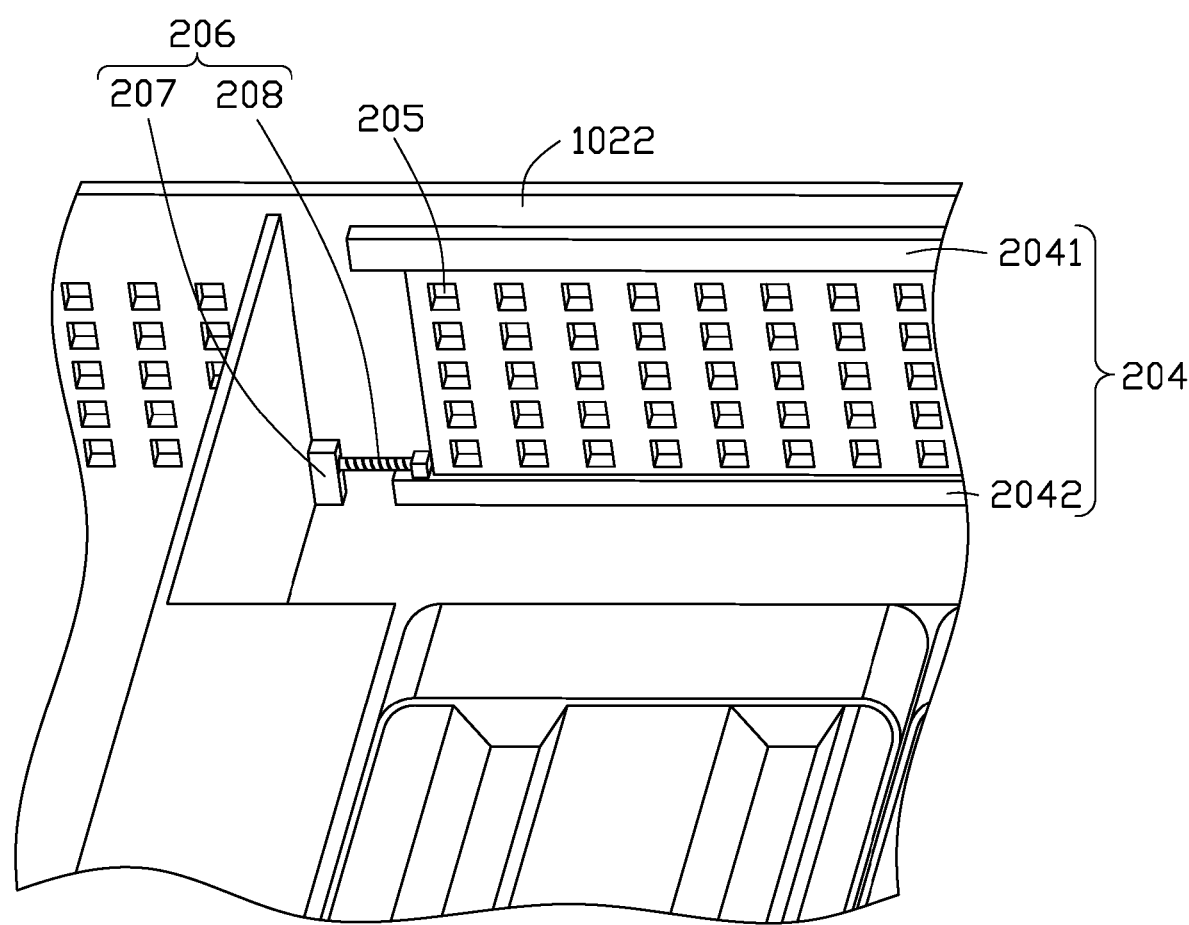
FIG. 8 is a schematic structural diagram of one embodiment of the first ventilation element in a closed mode.

FIG. 8 illustrates the first ventilation element 2031 in a closed mode. In one embodiment, when the temperature sensor 11 in the temperature control device 200 detects that the server 10 is below the preset temperature, the control unit 12 outputs the first control signal to the switch 207, and the switch 207 is switched to a closed state, and the driving element 208 controls the ventilation plate 205 to slide, so that the through holes on the ventilation plate 205 and the through holes on the frame 1022 are not aligned, and the exterior environment and interior of the server 10 are thus not connected. Therefore, the heat generated by the first heating sheet 1002 in the temperature control device 200 will not escape to the exterior environment through the first ventilation element 2031 and the second ventilation element 2032, and the interior of the server 10 can be rapidly heated, thereby improving the heating rate and heating efficiency inside the server 10.

Figure 9:
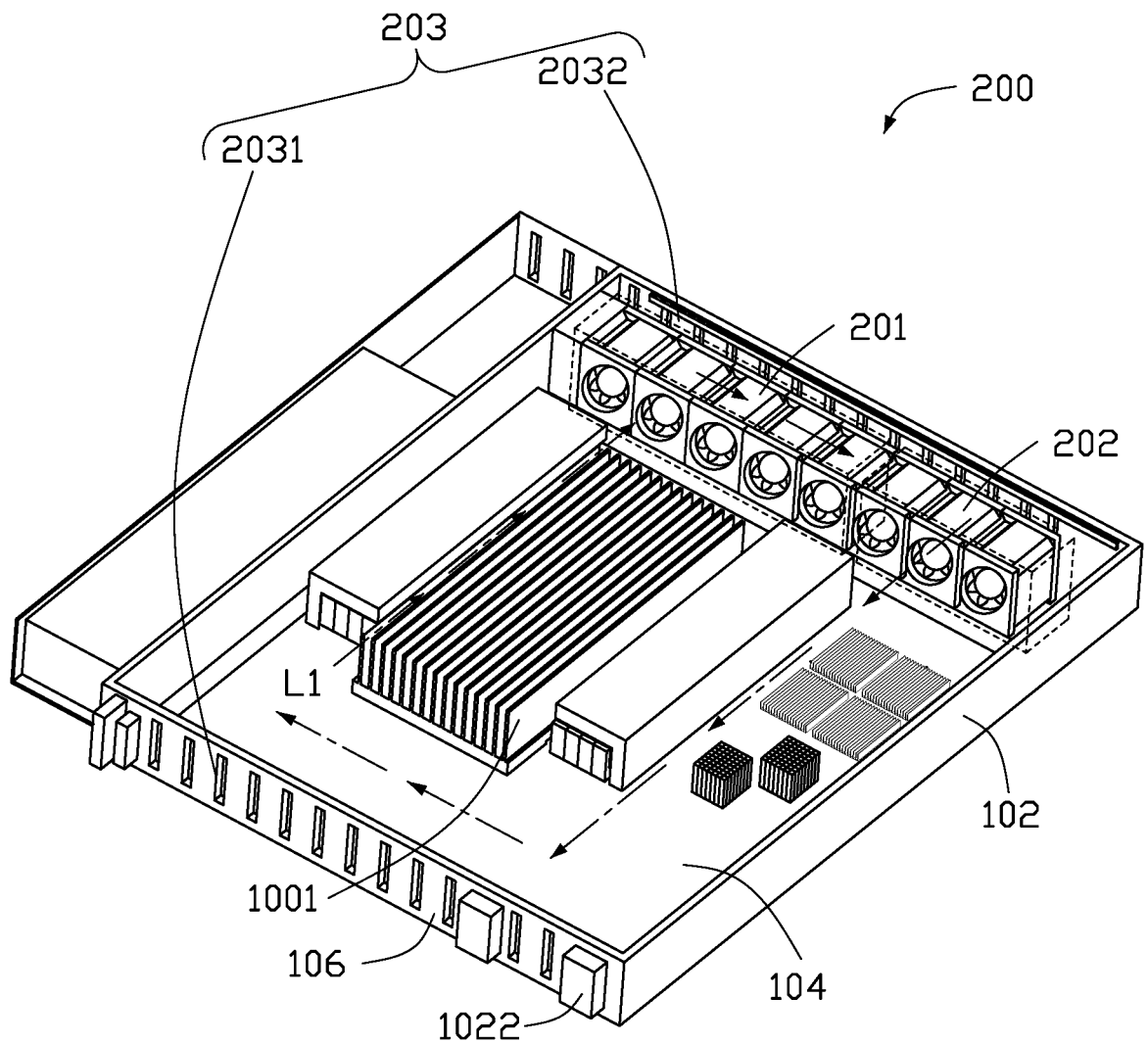
FIG. 9 is a schematic diagram of one embodiment of a first air duct.

FIG. 9 illustrates a first air duct L1 of the temperature control device 200. When the temperature sensor 11 detects that the temperature in the server 10 is lower than the preset temperature, the control unit 12 outputs the first control signal to the switching element 207 of the first ventilation element 2031 and the second ventilation element 2032. The switching element 207 controls the alignment or non-alignment of the through holes on the ventilation plate 205 and the through holes on the frame 1022, so that the interior of the server 10 is not open and connected to the exterior environment.

In one embodiment, the control unit 12 outputs the first control signal to the first fan 201, and outputs the second control signal to the second fan 202. The first fan 201 is turned on according to the first control signal, and the second fan 202 is turned off according to the second control signal A path for heat flow in the server 10 is formed in the first air duct L1, so as to conduct heat to the mainboard 104 and the components on the mainboard 104 by the first air duct L1, therefore increasing the temperature of the mainboard 104 and the components on it, so that the server 10 can quickly reach the preset temperature and work normally.

Figure 10:
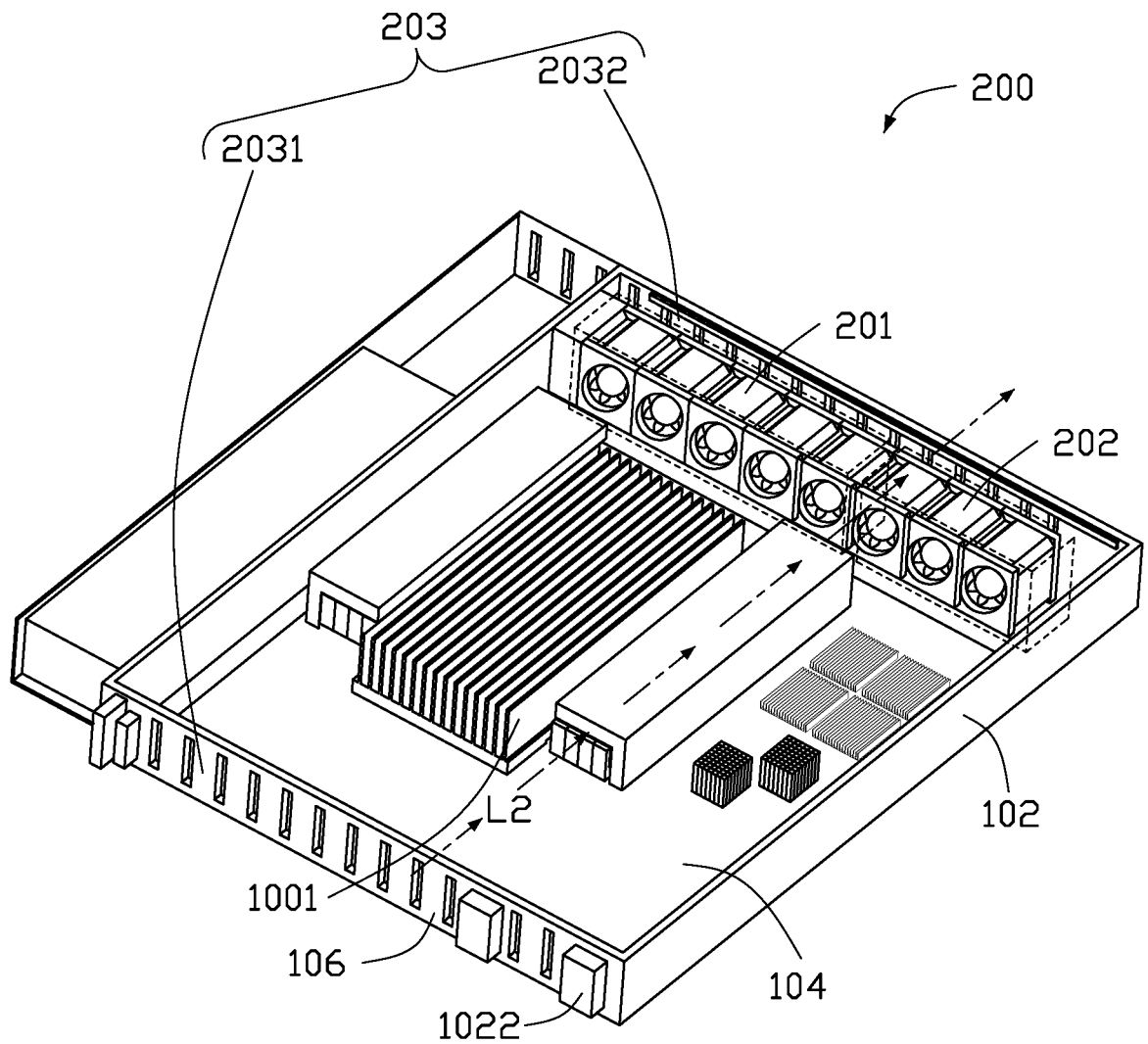
FIG. 10 is a schematic diagram of one embodiment of a second air duct.

FIG. 10 illustrates a second air duct L2 of the temperature control device 200.

When the temperature sensor 11 detects that the temperature in the server 10 is not below the preset temperature, the control unit 12 outputs the first control signal to the switching element 207 of the first ventilation element 2031 and the second ventilation element 2032. The switch 207 controls the through holes on the ventilation plate 205 to align with the through holes on the frame 1022, so that the interior of the server 10 connects to the exterior environment.

The control unit 12 further outputs the first control signal to the first fan 201 and the second fan 202. The first fan 201 and the second fan 202 are activated according to the first control signal, and the path for heat flow in the server 10 is formed in a second air duct L2, thereby the heat in the server 10 is dissipated to the exterior environment by the second air duct L2.

Figure 11:
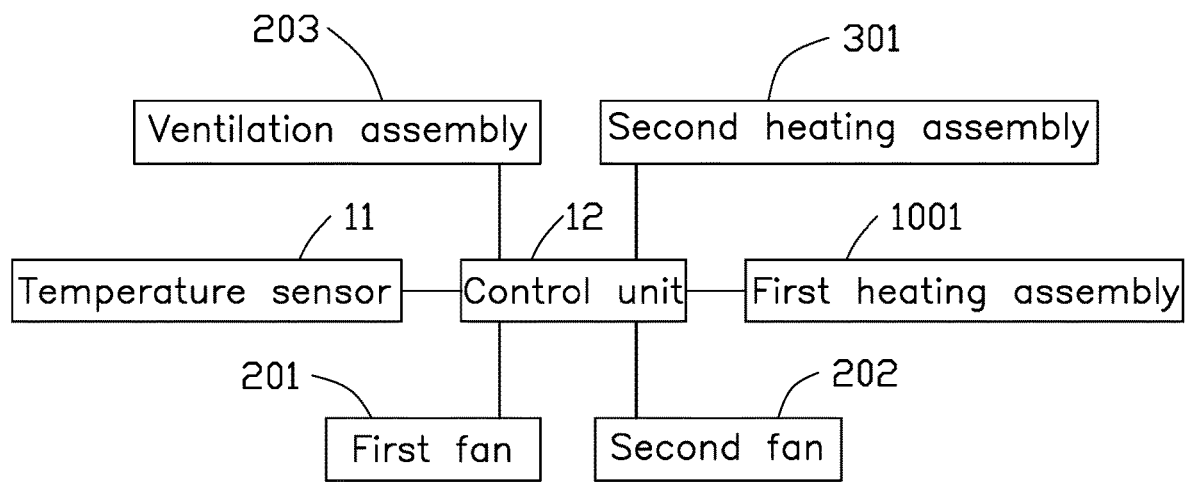
FIG. 11 is a schematic diagram of another embodiment of the circuit module of the temperature control device.

FIG. 11 illustrates another embodiment of the circuit module of the temperature control device 300. In one embodiment, the temperature control device 300 further includes a second heating assembly 301.

The control unit 12 is electrically connected to the second heating assembly 301, and the control unit 12 outputs the first control signal or the second control signal to the second heating assembly 301 according to the temperature signal, so as to control the second heating assembly 301 to heat the server 10 or to stop heating.

Figure 12A:
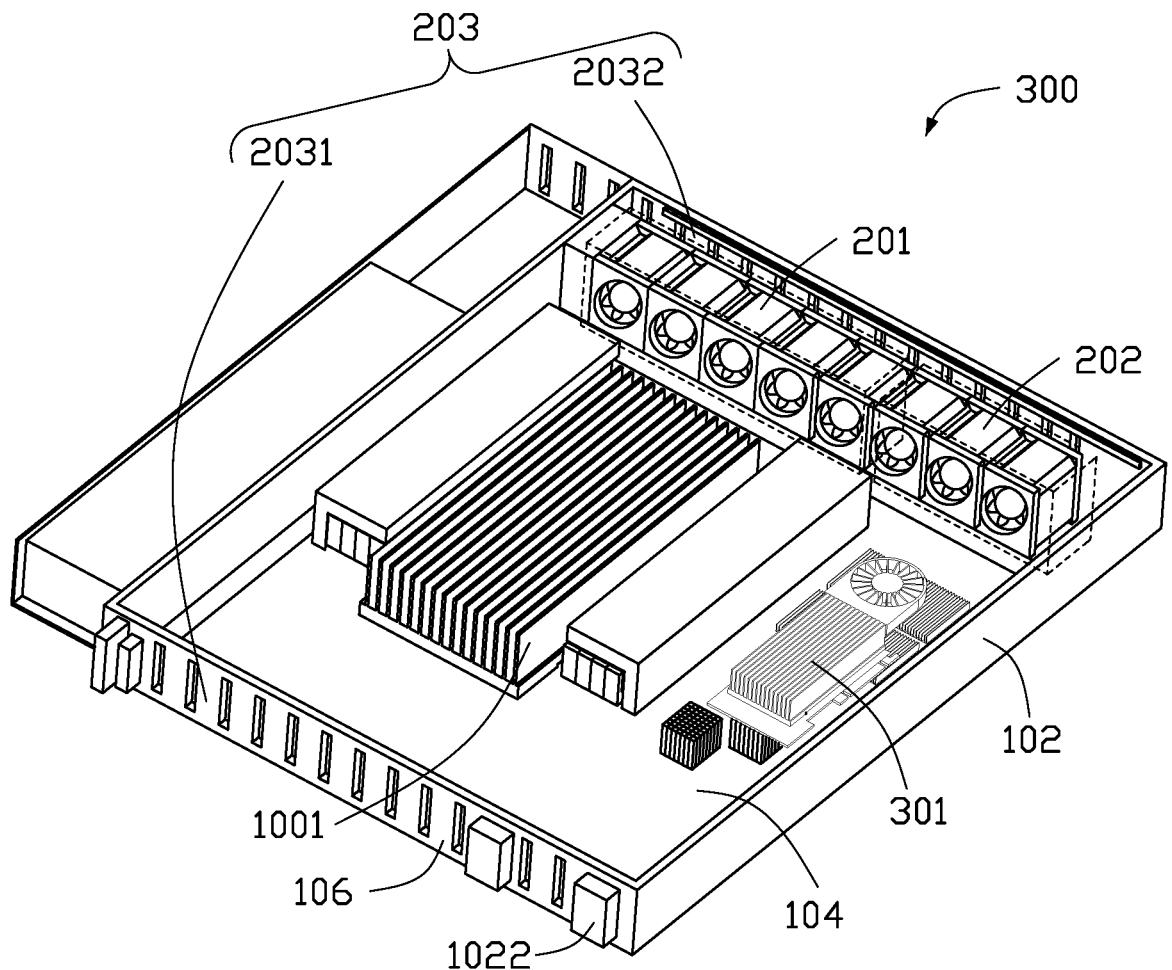
FIG. 12A is a schematic structural diagram of the temperature control device in FIG. 11.
Figure 12B:
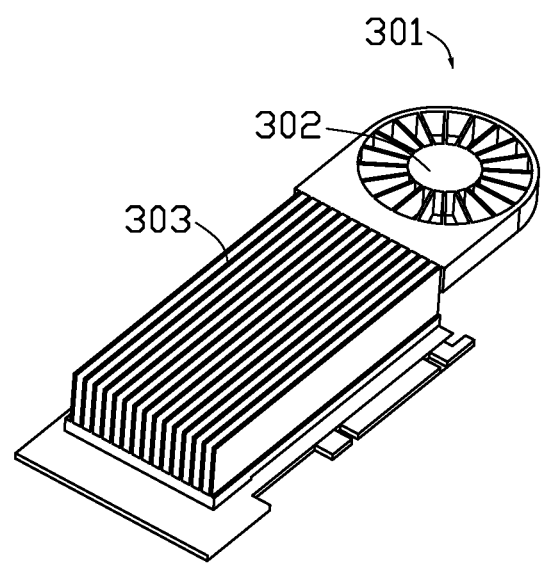
FIG. 12B is a schematic structural diagram of a second heating assembly of FIG. 11.

Referring to FIGS. 12A and 12B, the second heating element 301 is disposed on the mainboard 104, and the second heating element is disposed opposite to the second fan 202. The second heating assembly 301 includes a third fan 302, a second heat dissipation fin set 303, a second heating sheet, and a second connecting element (not shown in the figures). The third fan 302 is disposed adjacent to the second heat dissipation fin set 303, and the connective relationship between the second heating sheet and the second connecting element is similar to the relationship between the first heating sheet 1002 and the first connecting element 1003 and other structures.

The control unit 12 outputs the first control signal to the second connecting element, and the second connecting element conducts the power feed from the external power supply or the power supply 101 to control the external power supply or the power supply 101 to pass current into the heating circuit of the server 10. In one embodiment, control unit 12 outputs the second control signal to the second connecting element, and the second connecting element controls the external power supply or the power supply 101 to stop passing current into the heating circuit of the server 10.

In one embodiment, the control unit 12 also outputs the first control signal or the second control signal to the third fan 302 to switch the third fan 302 on or off.

Figure 13:
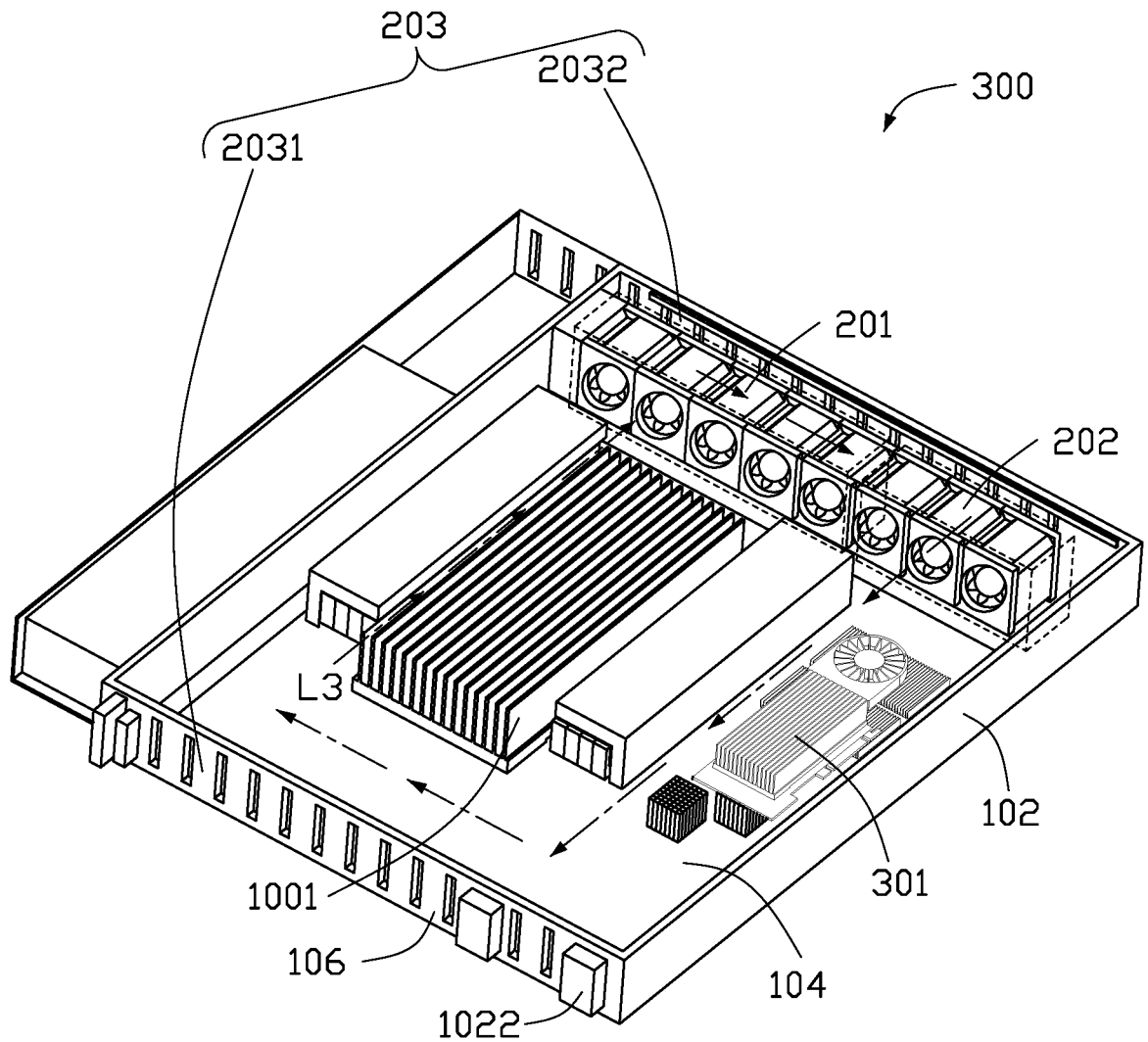
FIG. 13 is a schematic diagram of one embodiment of a third air duct.

FIG. 13 illustrates a third air duct L3 of the temperature control device 300. When the temperature sensor 11 detects that the temperature in the server 10 is lower than the preset temperature, the control unit 12 outputs the first control signal to the switching element 207 of the first ventilation element 2031 and the second ventilation element 2032. The switching element 207 controls the through holes on the ventilation plate 205 to be non-aligned with the through holes on the frame 1022, so that the interior of the server 10 is not connected to the exterior environment.

The control unit 12 also outputs the first control signal to the first fan 201 and the third fan 302, and outputs the second control signal to the second fan 202, and the first fan 201 and the third fan 302 are turned on according to the first control signal, and the second fan 202 is turned on according to the second control signal, thus, the heat flow path in the server 10 is formed in the third air duct L3, so as to conduct heat to the mainboard 104 and the components on the mainboard 104 by the third air duct L3, thereby increasing the temperature of the mainboard 104 and the components of the mainboard, so that the server 10 can quickly reach the preset temperature and work normally.

Figure 14:
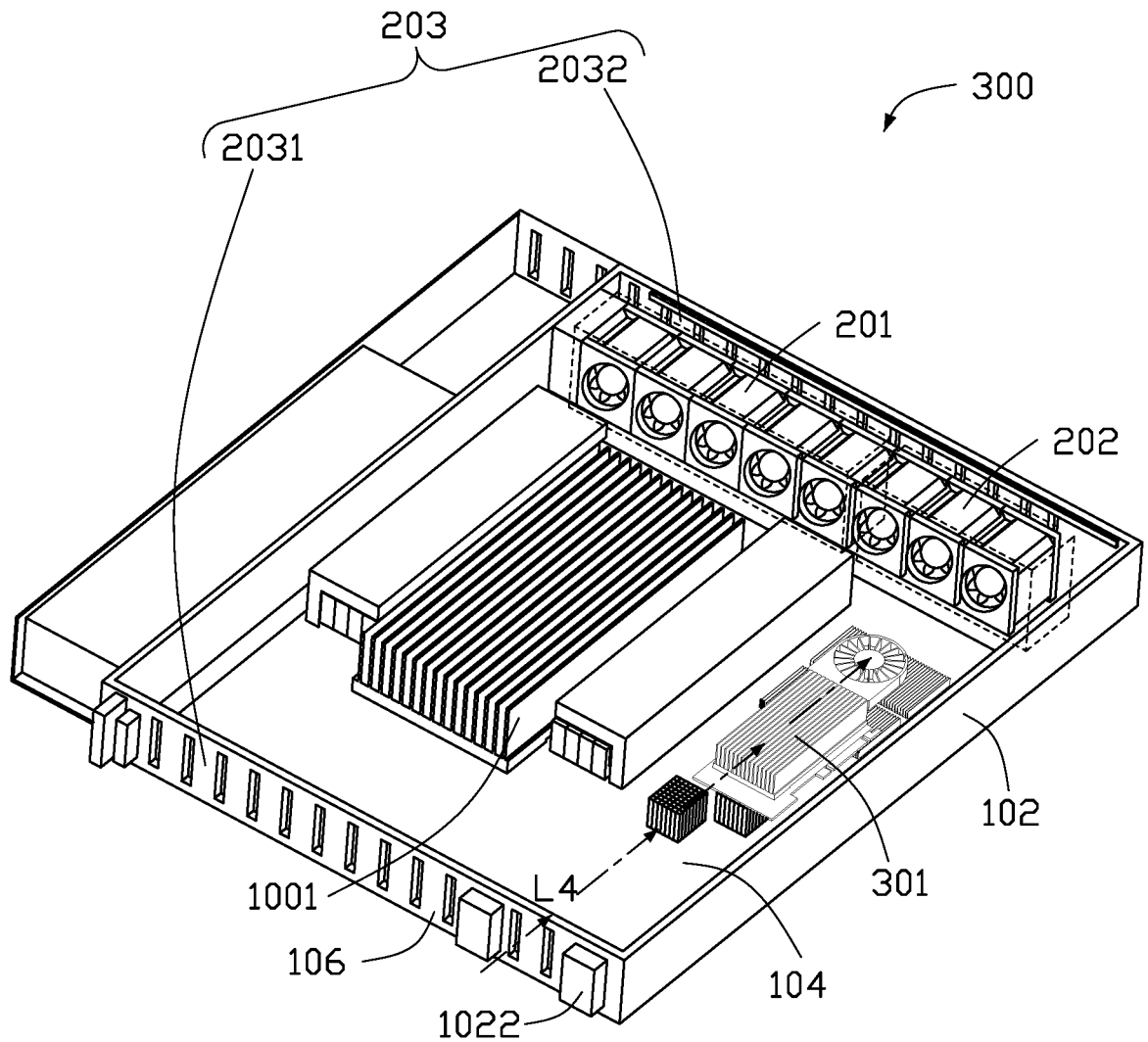
FIG. 14 is a schematic diagram of one embodiment of a fourth air duct.

FIG. 14 illustrates a fourth air duct L3 of the temperature control device 300. When the temperature sensor 11 detects that the temperature in the server 10 is not lower than the preset temperature, the control unit 12 outputs the first control signal to the switching element 207 of the first ventilation element 2031 and the second ventilation element 2032. The switching element 207 controls the through holes on the ventilation plate 205 to be aligned with the through holes on the frame 1022, so that the interior of the server 10 connects to the exterior environment.

The control unit 12 further outputs the first control signal to the first fan 201, the second fan 202 and the third fan 302, so that the first fan 201, the second fan 202 and the third fan 302 are all activated, thus the heat flow path in the server 10 is formed in the fourth air duct L4, so that the heat in the server 10 is dissipated to the exterior environment by the fourth air duct L4.

Figure 15:
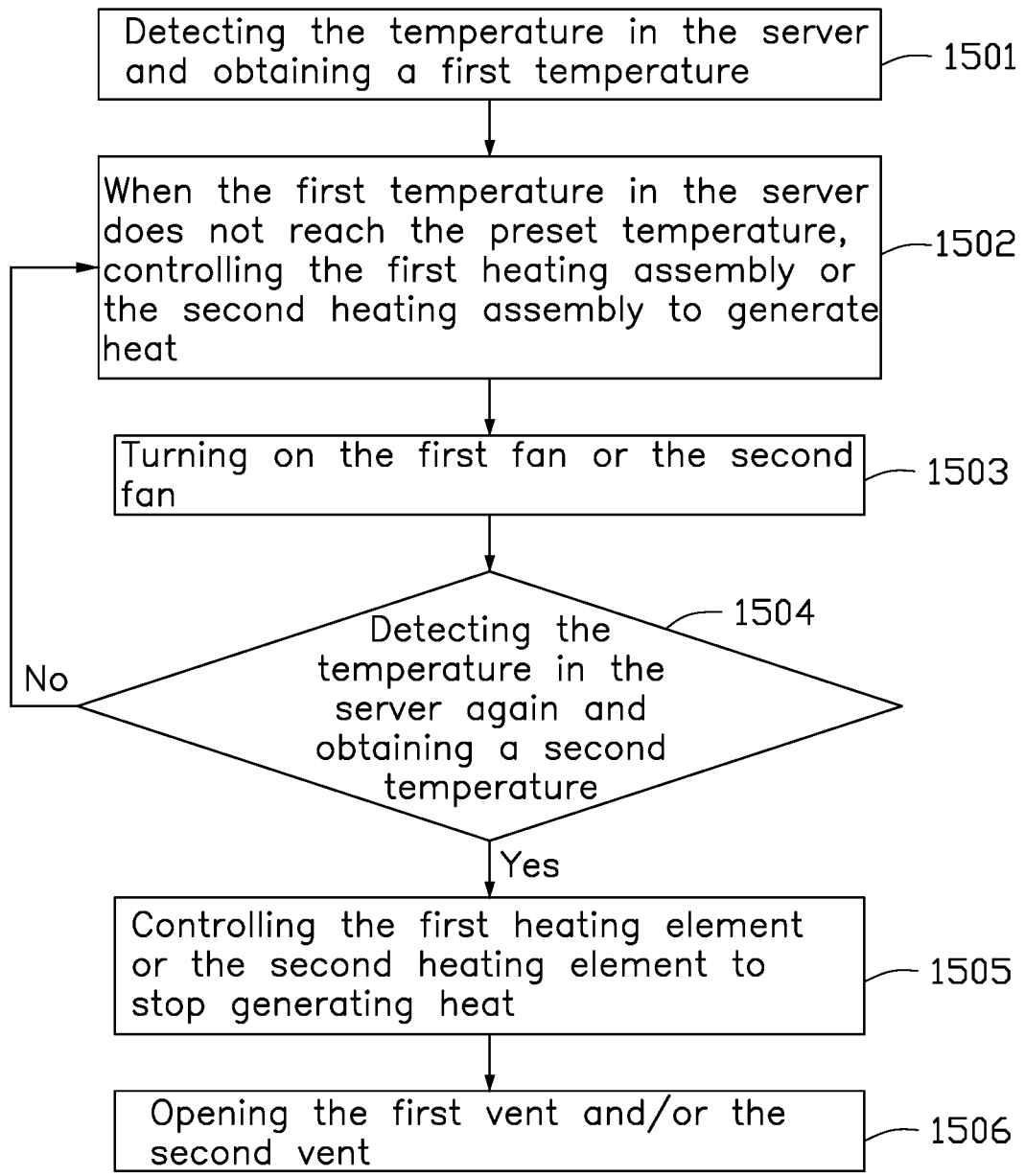
FIG. 15 is a flowchart of one embodiment of a temperature control method.

FIG. 15 illustrates a temperature control method. The method is applied in any one of the temperature control device 100, the temperature control device 200, and the temperature control device 300. The method is provided by way of example, as there are a variety of ways to carry out the method. Each block shown in FIG. 1 represents one or more processes, methods, or subroutines carried out in the example method. Furthermore, the illustrated order of blocks is by example only and the order of the blocks can be changed. Additional blocks may be added or fewer blocks may be utilized, without departing from this disclosure. The example method can begin at block 1501.

At block 1501, detecting the temperature in the server and obtaining a first temperature.

In one embodiment, the temperature in the server 10 can be detected by the temperature sensor 11.

At block 1502, when the first temperature in the server does not reach the preset temperature, controlling the first heating assembly or the second heating assembly to generate heat.

In one embodiment, when the temperature sensor 11 detects that the first temperature in the server 10 is below the preset temperature, the control unit 12 outputs the first control signal to control the first heating assembly 1001 or the second heating assembly 301 to generate heat. The generated heat is released into the interior of the server 10 by the first heat dissipation fin set 1004 or the second heat dissipation fin set 303.

At block 1503, turning on the first fan or the second fan.

In one embodiment, when the temperature sensor 11 detects that the temperature in the server 10 is below the preset temperature, the control unit 12 outputs the first control signal to activate the first fan 201 or the second fan 202 to enhance heat conduction. Specifically, for the temperature control device 200, the first fan 201 is turned on and the second fan 202 is turned off, and for the temperature control device 300, the first fan 201 is turned off and the second fan 202 is turned on.

At block 1504, detecting the temperature in the server again and obtaining a second temperature. When the second temperature in the server 10 is below the preset temperature, blocks 1502-1503 are executed, when the second temperature in the server 10 is below the preset temperature, block 1505 is executed.

At block 1505, controlling the first heating element or the second heating element to stop generating heat.

In one embodiment, when the temperature sensor 11 detects that the second temperature in the server 10 is at the preset temperature, the control unit 12 outputs a second control signal, so that the first heating element 1001 or the second heating element 301 stops heating, so as to slow down temperature rise in the server 10 and allow the server 10 to cool.

At block 1506, opening the first vent and/or the second vent.

It should be noted that, before the server 10 is powered on, both the first ventilation element 2031 and the second first ventilation element 2032 are in the closed state. In order to prevent the temperature from being lower than the preset temperature, the first ventilation element 2031 and the second ventilation element 2032 dissipate the heat inside the server 10 to the exterior environment.

When the temperature sensor 11 detects that the temperature in the server 10 reaches the preset temperature, the control unit 12 outputs the second control signal, and the switch assembly 206 aligns the through holes provided on the first ventilation member 2031 and the second ventilation member 2032 with the through holes provided on the frame 1022 to open a path between the server 10 and the exterior environment, so as to accelerate the heat dissipation of the server 10.

The exemplary embodiments shown and described above are only examples. Even though numerous characteristics and advantages of the present disclosure have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims.

What is claimed is:

1. A temperature control device comprising:
    a temperature sensor that detects a temperature of a server;
    a heating assembly;
    a ventilation assembly; and
    a control unit being electrically connected to the temperature sensor, the heating assembly and the ventilation assembly, wherein
    the control unit determines whether the temperature in the server is less than a preset temperature,
    when the temperature in the server is lower than the preset temperature, the control unit outputs a first control signal to the heating assembly and the ventilation assembly, the heating assembly heats the server according to the first control signal, and the ventilation assembly is switched to a closed state according to the first control signal, the closed state is configured to retain a heat generated by the heating assembly in the server, and
    when the temperature in the server is not less than the preset temperature, the control unit outputs a second control signal to the heating assembly and the ventilation assembly, the heating assembly stops heating the server according to the second control signal, and the ventilation assembly is switched to an open state according to the second control signal, the open state is configured to dissipate the heat from the server.

2. The temperature control device as recited in claim 1, wherein the heating assembly comprises a heating sheet and a heat dissipation fin set, the heating sheet is attached to one side of the heat dissipation fin set, and the heating sheet is electrically connected to a power supply, when the temperature in the server is less than the preset temperature, the control unit further controls the heating sheet to heat, and conducts the heat to the heat dissipation fin set, and the heat dissipation fin set conducts the heat to an interior of the server.

3. The temperature control device as recited in claim 1, wherein the ventilation assembly comprises a track and a ventilation plate, the track comprises a first extension element and a second extension element, the first extension element protrudes from a surface of a frame, and the first extension is bent and arranged parallel to the surface of the frame, the second extension element is disposed opposite to the first extension element, an accommodating space is defined between the first extension element and the second extension element, and the ventilation plate is arranged in the accommodating space.

4. The temperature control device as recited in claim 3, wherein the ventilation plate is provided with first through holes, and the frame is provided with second through holes correspondingly positioned relative to the first through holes.

5. The temperature control device as recited in claim 4, wherein the ventilation assembly comprises a switch and a driving element, one end of the driving element is connected to the switch, and the other end of the driving element is connected to the ventilation plate, the switch controls the driving element to push the ventilation plate to make the ventilation plate slide on the track.

6. The temperature control device as recited in claim 5, wherein:
    when the temperature in the server is lower than the preset temperature, the ventilation assembly is switched to the closed state wherein the driving element drives the ventilation plate to slide on the track, and the first through holes of the ventilation plate and the second through holes of the frame are misaligned, and the interior of the server is disconnected to exterior environment; and
    when the temperature in the server reaches the preset temperature, the ventilation assembly is switched to the open state wherein the driving element drives the ventilation plate to slide on the track, and the first through holes of the ventilation plate are aligned with the second through holes of the frame, and the interior of the server is communicated to the exterior environment.

7. The temperature control device as recited in claim 2, wherein the server further comprises a first fan and a second fan, the first fan is arranged adjacent to the second fan, and the first fan is arranged opposite to the heat dissipation fin set.

8. The temperature control device as recited in claim 7, when the first fan is turned on and the second fan is turned off, a first air duct is formed to facilitate heating of the server; when the first fan and the second fan are turned on, a second air duct is formed to facilitate cooling of the server.

9. The temperature control device as recited in claim 7, further comprising a third fan installed on the heat dissipation fin set, wherein the third fan dissipates heat on the heat dissipation fin set into the interior of the server, when the first fan and the third fan are turned on and the second fan is turned off, a third air duct is formed to further facilitate the heating of the server; when the first fan, the second fan and the third fan are turned on, a fourth air duct is formed to further facilitate cooling of the server.

10. A server comprising:
    a power supply;
    a housing comprising a frame;
    a temperature control device; and a processor connected to the power supply and the temperature control device, wherein:

the temperature control device comprises a temperature sensor that detects a temperature of the server, a heating assembly, a ventilation assembly, and a control unit, and the control unit is electrically connected to the temperature sensor, the heating assembly and the heating assembly; the control unit determines whether the temperature in the server is less than a preset temperature, and when the temperature in the server is lower than the preset temperature, the control unit outputs a first control signal to the heating assembly and the ventilation assembly, the heating assembly heats the server according to the first control signal, and the ventilation assembly is switched to a closed state according to the first control signal, the closed state is configured to retain a heat generated by the heating assembly in the server; and when the temperature in the server is not less than the preset temperature, the control unit outputs a second control signal to the heating assembly and the ventilation assembly, the heating assembly stops heating the server according to the second control signal, and the ventilation assembly is switched to an open state according to the second control signal, the open state is configured to dissipate the heat from the server.

11. The server as recited in claim 10, wherein the heating assembly comprises a heating sheet and a heat dissipation fin set, the heating sheet is attached to one side of the heat dissipation fin set, and the heating sheet is electrically connected to the power supply, when the temperature in the server is less than the preset temperature, the control unit controls the heating sheet to heat, and conducts the heat to the heat dissipation fin set, and the heat dissipation fin set conducts the heat to an interior of the server.

12. The server as recited in claim 10, wherein the ventilation assembly comprises a track and a ventilation plate, the track comprises a first extension element and a second extension element, the first extension element protrudes from a surface of the frame, and the first extension is bent and arranged parallel to the surface of the frame, the second extension element is disposed opposite to the first extension element, an accommodating space is defined between the first extension element and the second extension element, and the ventilation plate is arranged in the accommodating space.

13. The server as recited in claim 12, wherein the ventilation plate is provided with first through holes, and the frame is provided with second through holes correspondingly positioned relative to the first through holes.

14. The server as recited in claim 13, wherein the ventilation assembly comprises a switch and a driving element, one end of the driving element is connected to the switch, and the other end of the driving element is connected to the ventilation plate, the switch controls the driving element to push the ventilation plate to make the ventilation plate slide on the track.

15. The server as recited in claim 14, wherein when the temperature in the server is lower than the preset temperature, the ventilation assembly is switched to the closed state wherein the driving element drives the ventilation plate to slide on the track, and the first through holes of the ventilation plate and the second through holes of the frame are misaligned, and the interior of the server is disconnected to exterior environment; and when the temperature in the server reaches the preset temperature, the ventilation assembly is switched to the open state wherein the driving element drives the ventilation plate to slide on the track, and the first through holes of the ventilation plate are aligned with the second through holes of the frame, and the interior of the server is communicated to the exterior environment.

16. The server as recited in claim 11, wherein the server further comprises a first fan and a second fan, the first fan is arranged adjacent to the second fan, and the first fan is arranged opposite to the heat dissipation fin set.

17. The server as recited in claim 16, wherein when the first fan is turned on and the second fan is turned off, a first air duct is formed to facilitate heating of the server; when the first fan and the second fan are turned on, a second air duct is formed to facilitate cooling of the server.

18. The server as recited in claim 16, wherein a third fan is installed on the heat dissipation fin set, the third fan dissipates the heat on the heat dissipation fin set into the interior of the server, when the first fan and the third fan are turned on and the second fan is turned off, a third air duct is formed to further facilitate the heating of the server; when the first fan, the second fan and the third fan are turned on, a fourth air duct is formed to further facilitate cooling of the server.

19. A temperature control method comprising:

detecting a first temperature in a server;

when the first temperature in the server does not reach a preset temperature, executing a heating method; when the first temperature in the server reaches the preset temperature, executing a cooling method;

detecting a second temperature in the server;

when the second temperature in the server does not reach the preset temperature, executing the heating method; when the second temperature in the server reaches the preset temperature, executing the cooling method; wherein, the heating method is executed by controlling a heating assembly to heat the server, and controlling a ventilation assembly to switch to a closed state, and retaining a heat generated by the heating assembly in the server;

the cooling method is executed by controlling the heating assembly to stop heating the server, and controlling the ventilation assembly to switch to an open state, dissipating the heat in the server to exterior environment.

20. The temperature control method as recited in claim 19 further comprising:

controlling first through holes of the ventilation assembly to be aligned with second through holes of a frame of the server.

* * * * *